United States Patent
Lee et al.

(10) Patent No.: US 9,099,687 B2
(45) Date of Patent: Aug. 4, 2015

(54) DONOR SUBSTRATE AND METHOD OF FORMING TRANSFER PATTERN USING THE SAME

(71) Applicant: SAMSUNG DISPLAY CO., LTD., Yongin, Gyeonggi-Do (KR)

(72) Inventors: Joon Gu Lee, Yongin (KR); Ji Young Choung, Yongin (KR); Jin Baek Choi, Yongin (KR); Hyunsung Bang, Yongin (KR); Yeon Hwa Lee, Yongin (KR); Won Jong Kim, Yongin (KR); Young-Woo Song, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/098,624

(22) Filed: Dec. 6, 2013

(65) Prior Publication Data
US 2014/0295587 A1    Oct. 2, 2014

(30) Foreign Application Priority Data
Mar. 29, 2013   (KR) .................... 10-2013-0034658

(51) Int. Cl.
*H01L 21/00* (2006.01)
*H01L 51/56* (2006.01)
*B41M 5/42* (2006.01)
*B41M 5/382* (2006.01)
*H01L 51/00* (2006.01)

(52) U.S. Cl.
CPC ........... *H01L 51/56* (2013.01); *B41M 5/38214* (2013.01); *B41M 5/42* (2013.01); *H01L 51/0013* (2013.01); *B41M 2205/38* (2013.01)

(58) Field of Classification Search
CPC ...... H01L 51/0013; G03G 5/028; B41M 5/42
USPC .............. 38/24; 430/307; 349/21, 22; 438/24
See application file for complete search history.

(56) References Cited

U.S. PATENT DOCUMENTS

| | | | |
|---|---|---|---|
| 2006/0246240 A1* | 11/2006 | Matsuda et al. | 428/32.39 |
| 2009/0305445 A1* | 12/2009 | Ikeda et al. | 438/29 |
| 2009/0325451 A1 | 12/2009 | Higo et al. | |
| 2010/0102251 A1* | 4/2010 | Ferrini et al. | 250/484.4 |
| 2013/0202812 A1* | 8/2013 | Higo et al. | 427/554 |

FOREIGN PATENT DOCUMENTS

| | | |
|---|---|---|
| JP | 2010-034022 A | 2/2010 |
| KR | 10-2011-0005514 A | 1/2011 |

* cited by examiner

*Primary Examiner* — Caridad Everhart
(74) *Attorney, Agent, or Firm* — Lee & Morse, P.C.

(57) ABSTRACT

A donor substrate includes a base substrate; a light reflection layer disposed on the base substrate and overlapped with a portion of the base substrate, a heat blocking pattern disposed on the light reflection layer, overlapped with the light reflection layer, and including a plurality of air holes; a light-to-heat conversion layer disposed on the base substrate; and a transfer layer disposed on the light-to-heat conversion layer.

23 Claims, 8 Drawing Sheets

(12) United States Patent
US 9,099,687 B2

DONOR SUBSTRATE AND METHOD OF FORMING TRANSFER PATTERN USING THE SAME

CROSS-REFERENCE TO RELATED APPLICATION

This application claims the benefit of and priority under 35 U.S.C. §119 to Korean Patent Application No. 10-2013-0034658, filed on Mar. 29, 2013, in the Korean Intellectual Property Office, and entitled: "DONOR SUBSTRATE AND METHOD OF FORMING TRANSFER PATTERN USING THE SAME," which is incorporated by reference herein in its entirety.

BACKGROUND

1. Field

Embodiments relate to a donor substrate and a method of forming a transfer pattern using the donor substrate.

2. Description of the Related Art

As a method of forming an organic/inorganic pattern (hereinafter, referred to as a transfer pattern) on a transfer-target substrate, a light-to-heat transfer method may be used. For instance, the light-to-heat transfer method may be used to form an organic light emitting device.

SUMMARY

Embodiments are directed to a donor substrate, including a base substrate; a light reflection layer disposed on the base substrate and overlapped with a portion of the base substrate; a heat blocking pattern disposed on the light reflection layer, overlapped with the light reflection layer, and including a plurality of air holes; a light-to-heat conversion layer disposed on the base substrate; and a transfer layer disposed on the light-to-heat conversion layer.

The light reflection layer may include a metal material.

The metal material may include aluminum, silver, or an alloy thereof.

The light reflection layer may include a plurality of openings.

The heat blocking pattern may have a same shape as the light reflection layer.

The light-to-heat conversion layer may be overlapped with openings of the heat blocking pattern and the light reflection layer.

The light-to-heat conversion layer may include a plurality of light-to-heat conversion patterns, the light-to-heat conversion patterns being inserted into the openings of the heat blocking pattern and the light reflection layer, and the light-to-heat conversion patterns and the heat blocking pattern may be provided with a flat surface.

Each of the openings of the heat blocking pattern may have a diameter from about 1 nm to about 50 nm.

The heat blocking pattern may include at least one of silicon oxide and silicon nitride.

The heat blocking pattern may have a thickness from about 10 nm to about 10 μm.

The light reflection layer may be disposed on the light-to-heat conversion layer.

The light-to-heat conversion layer may include a groove portion, the light reflection layer and the heat blocking pattern being inserted into the groove portion.

The donor substrate may further include a planarization layer disposed between the light-to-heat conversion layer and the transfer layer, the planarization layer covering the light reflection layer and the heat blocking pattern.

Embodiments are also directed to a method of forming a transfer pattern, the method including disposing a donor substrate on a transfer-target substrate, the donor substrate including a base substrate, a light reflection layer disposed on the base substrate and overlapped with a portion of the base substrate, a heat blocking pattern disposed to overlap with the light reflection layer and including a plurality of air holes, a light-to-heat conversion layer disposed on the base substrate, and a transfer layer disposed on the light-to-heat conversion layer, the transfer layer contacting the transfer-target substrate; irradiating a light onto the donor substrate to transfer a transfer pattern on the transfer-target substrate; and removing the donor substrate from the transfer-target substrate.

The transfer pattern may serve as a part of an organic light emitting device.

The transfer pattern may be a hole transport layer or an organic light emitting layer, which corresponds to the part of the organic light emitting device.

The light reflection layer may include a plurality of openings.

The heat blocking pattern may have a same shape as the light reflection layer.

The light-to-heat conversion layer may be overlapped with openings of the heat blocking pattern and the light reflection layer.

The light-to-heat conversion layer may include a plurality of light-to-heat conversion patterns, the light-to-heat conversion patterns being inserted into the openings, and the light-to-heat conversion patterns and the heat blocking pattern may be provided with a flat surface.

The light reflection layer may be disposed on the light-to-heat conversion layer.

The light-to-heat conversion layer may include a groove portion, the light reflection layer and the heat blocking pattern being inserted into the groove portion.

The method may further include a planarization layer disposed between the light-to-heat conversion layer and the transfer layer to cover the light reflection layer and the heat blocking pattern.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. Like reference numerals refer to like elements throughout.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
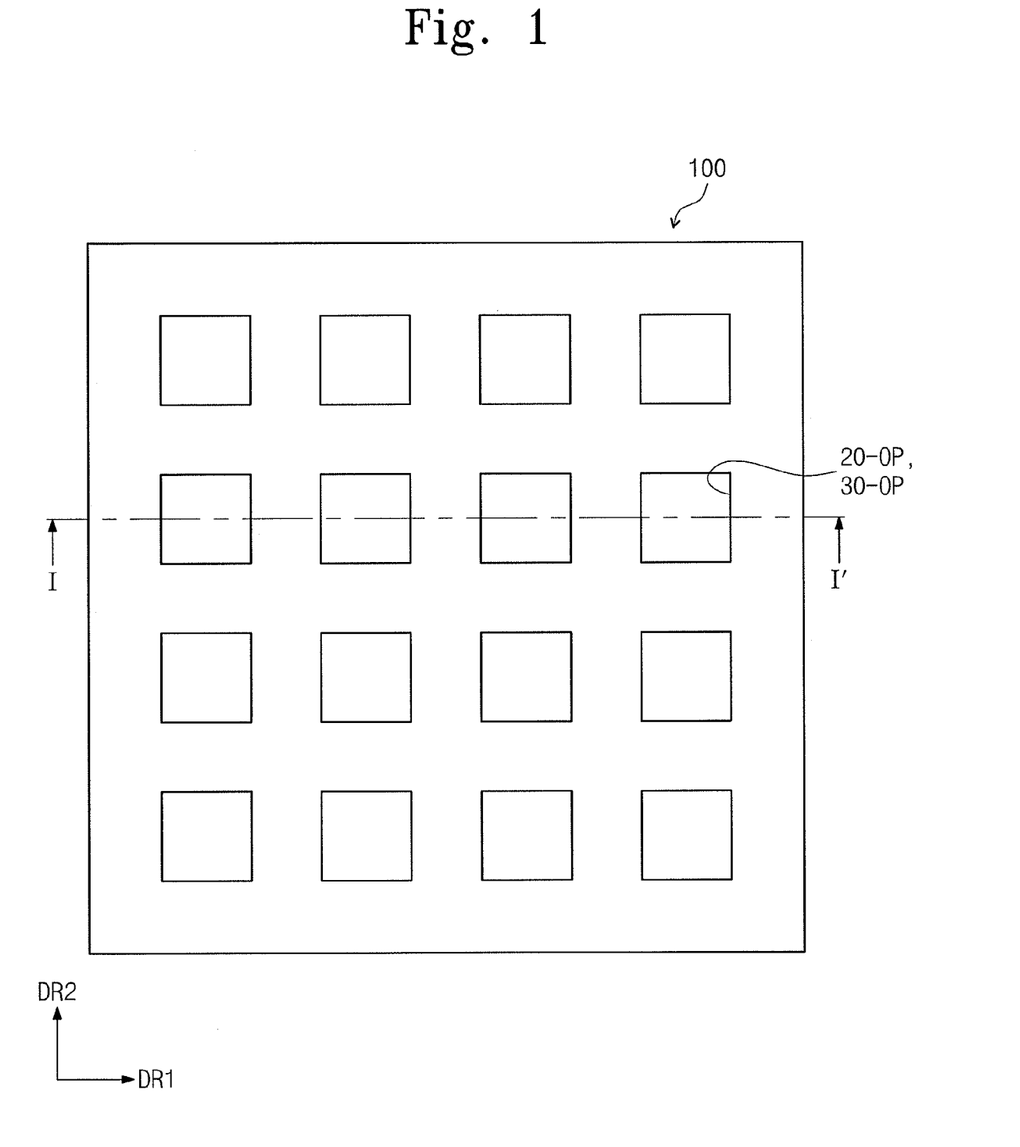
FIG. 1 is a plan view showing a donor substrate according to an example embodiment.
Figure 2:
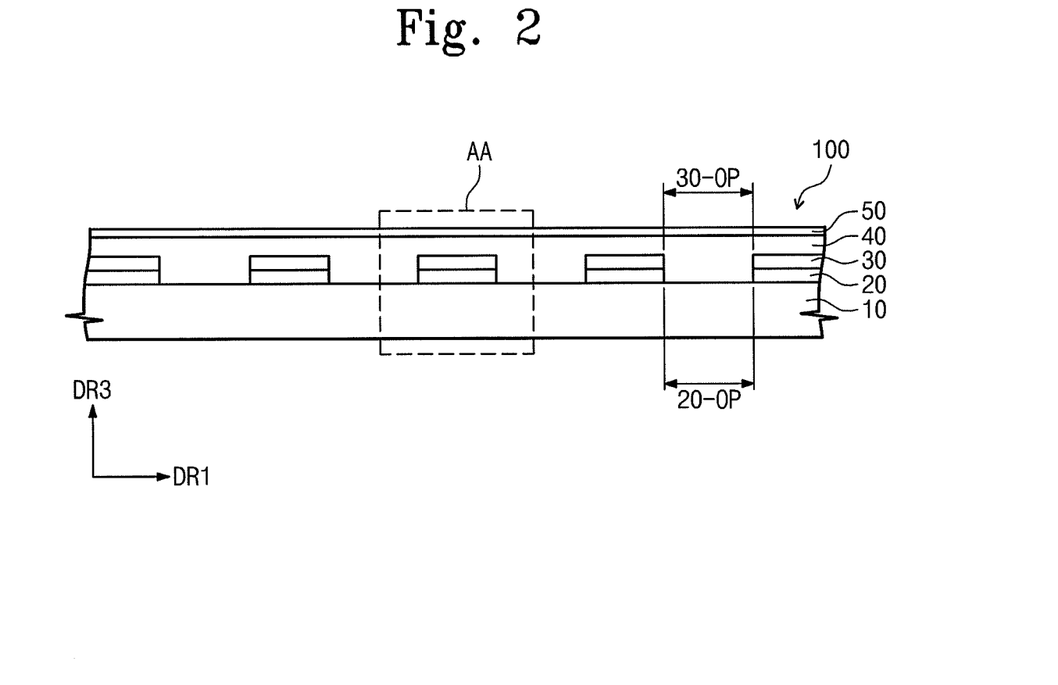
FIG. 2 is a cross-sectional view taken along a line I-I' of FIG. 1.
Figure 3:
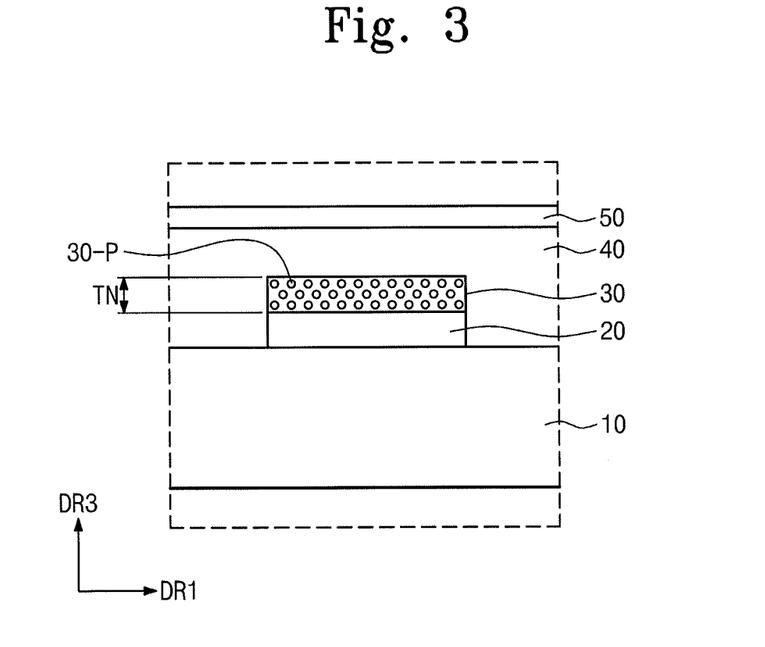
FIG. 3 is a partially enlarged view showing a portion AA of FIG. 2.
Figure 4:
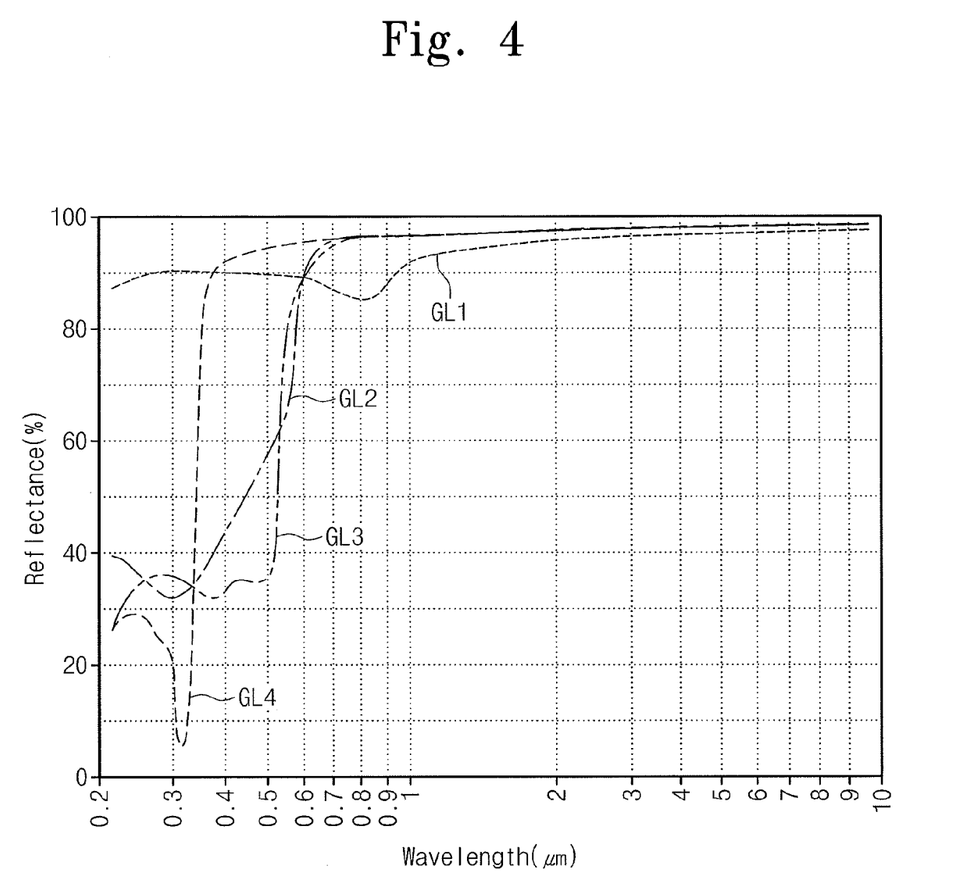
FIG. 4 is a graph showing a light reflectance of a light reflection layer according to an example embodiment.

FIG. 1 is a plan view showing a donor substrate according to an example embodiment, FIG. 2 is a cross-sectional view taken along a line I-I' of FIG. 1, FIG. 3 is a partially enlarged view showing a portion AA of FIG. 2, and FIG. 4 is a graph showing a light reflectance of a light reflection layer according to an example embodiment.

Referring to FIGS. 1 and 2, a donor substrate 100 includes a base substrate 10, a light reflection layer 20, a heat blocking pattern 30, a light-to-heat conversion layer 40, and a transfer layer 50. The light reflection layer 20, the heat blocking pattern 30, the light-to-heat conversion layer 40, and the transfer layer 50 are disposed on one surface of the base substrate 10.

In the present example embodiment, the base substrate 10 is a transparent substrate configures to transmit a light incident to the other surface of the base substrate 10 (opposite to the one surface of the base substrate 10) to the light-to-heat conversion layer 40. The base substrate 10 may include at least one polymer material selected from the group of polyester, polyacryl, poly-epoxy, polyethylene, polystyrene, and polyethylene terephthalate. In addition, the base substrate 10 may be formed of glass or quartz. The base substrate 10 has a thickness of, e.g., about 10 μm to about 500 μm.

The light reflection layer 20 is disposed on the one surface of the base substrate 10. The light reflection layer 20 is overlapped with a portion of the base substrate 10. The light reflection layer 20 partially blocks the light incident thereto through the other surface of the base substrate 10.

The light reflection layer 20 has a specific shape in a plan view to divide the transfer layer 50 into an area that is transferred and an area that is not transferred. For example, the light reflection layer 20 has a plurality of openings 20-OP (hereinafter, referred to as first openings).

A transfer pattern TP (shown in FIG. 5C) has a shape determined depending on a shape of the first openings 20-OP. The light reflection layer 20 has a shape determined by the shape of the transfer pattern to be formed. For instance, the light reflection layer 20 may have a stripe shape, or the light reflection layer 20 may be omitted in order to transfer the entire surface of the transfer layer 50.

The light reflection layer 20 includes a metal material. Referring to FIG. 4, a first graph GL1 represents the reflectance of the light reflection layer formed of aluminum, a second graph GL2 represents the reflectance of the light reflection layer formed of copper, a third graph GL3 represents the reflectance of the light reflection layer formed of gold, and a fourth graph GL4 represents the reflectance of the light reflection layer formed of silver. In the present example embodiment, the light reflection layer 20 is formed of aluminum, aluminum alloy, silver, or silver alloy, which have high reflectance with respect to a visible light.

The heat blocking pattern 30 will be described in detail with reference to FIGS. 2 and 3. The heat blocking pattern 30 is disposed on the light reflection layer 20. The heat blocking pattern 30 prevents a heat, which is generated from the light absorbed by the light reflection layer 20, from being transmitted to the light-to-heat conversion layer 40 or the transfer layer 50.

In the present example embodiment, the heat blocking pattern 30 has the same shape as the light reflection layer 20 in a plan view. The heat blocking pattern 30 includes a plurality of openings 30-OP (hereinafter, referred to as second openings) respectively corresponding to the first openings 20-OP.

The heat blocking pattern 30 includes an insulating material having a plurality of air holes or pores 30-P. The heat blocking pattern 30 provides the same function as an air gap to reduce a thermal conductivity. The heat blocking pattern 30 includes an organic material or an inorganic material, such as silicon oxide or silicon nitride. The heat blocking pattern 30 includes at least one of the silicon oxide and the silicon nitride. Each air hole 30-P has a diameter from about 1 nm to about 50 nm.

The plurality of air holes 30-P is generated, when the heat blocking pattern 30 is formed on the light reflection layer 20. A mixture including a base material and particles dispersed in the base material is provided on the light reflection layer 20. The base material includes the silicon oxide or silicon nitride and the particles include functional groups. The functional groups are weak in heat. When the heat is applied to the mixture, the particles are removed. Spaces that correspond to the particles define the plurality of air holes 30-P.

Alternatively, a base material including functional groups is provided on the light reflection layer 20. The base material includes the silicon oxide or silicon nitride. The functional groups are chemically or physically bonded to the base material. The functional groups are weak in heat. When the heat is applied to the mixture, the functional groups are removed.

The diameter of the each of the air holes 30-P is dependent to chemical structures of the functional groups. Properly, each air hole 30-P has a diameter from about 1 nm to about 10 nm.

The heat blocking pattern 30 has a thickness TN from about 10 nm to about 10 μm in a thickness direction DR3 (hereinafter, referred to as a third direction) thereof. The third direction DR3 is perpendicular to both of a first direction DR1 and a second direction DR2, which define a transfer surface of the donor substrate 100.

The light-to-heat conversion layer 40 absorbs the light incident thereto to convert the absorbed light to heat. The light-to-heat conversion layer 40 may absorb a specific wavelength of the incident light, e.g. infrared rays or visible rays. The light-to-heat conversion layer 40 may include carbon black, graphite, a metal oxide material, or a metal sulfide material.

The light-to-heat conversion layer 40 may further include a binder. The light-to-heat conversion layer 40 may be an organic layer in which the carbon black is dispersed in an organic binder, or a metal layer including the metal oxide material or the metal sulfide material.

The light-to-heat conversion layer 40 is disposed to overlap with at least the first openings 20-OP. The light-to-heat conversion layer 40 covers the heat blocking pattern 30 disposed on the light reflection layer 20 and is disposed on the entire surface of the base substrate 10. The light-to-heat conversion layer 40 may have a flat surface.

The transfer layer 50 is disposed on the light-to-heat conversion layer 40. The transfer layer 50 is overlapped with at least the first openings 20-OP. The transfer layer 50 includes an organic material that is transferred upon receiving thermal energy. For instance, the transfer layer 50 may include an organic material for a color filter or a functional material for an organic light emitting device as an organic material vaporized by the thermal energy, however, it should not be limited thereto or thereby.

Figure 5A:
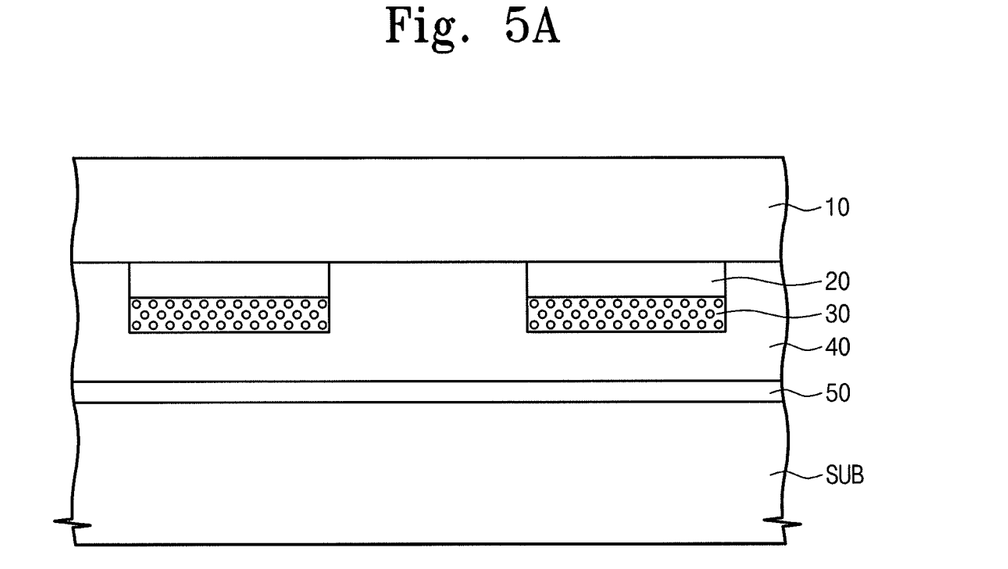
FIGS. 5A to 5C are process cross-sectional views showing a manufacturing method of a transfer pattern according to an example embodiment.
Figure 5B:
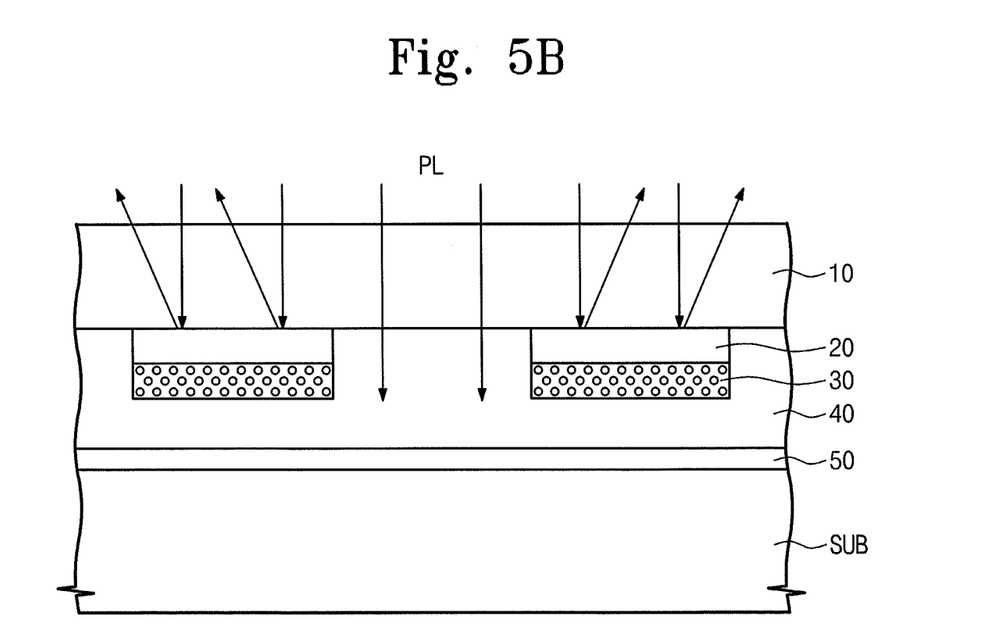
Figure 5C:
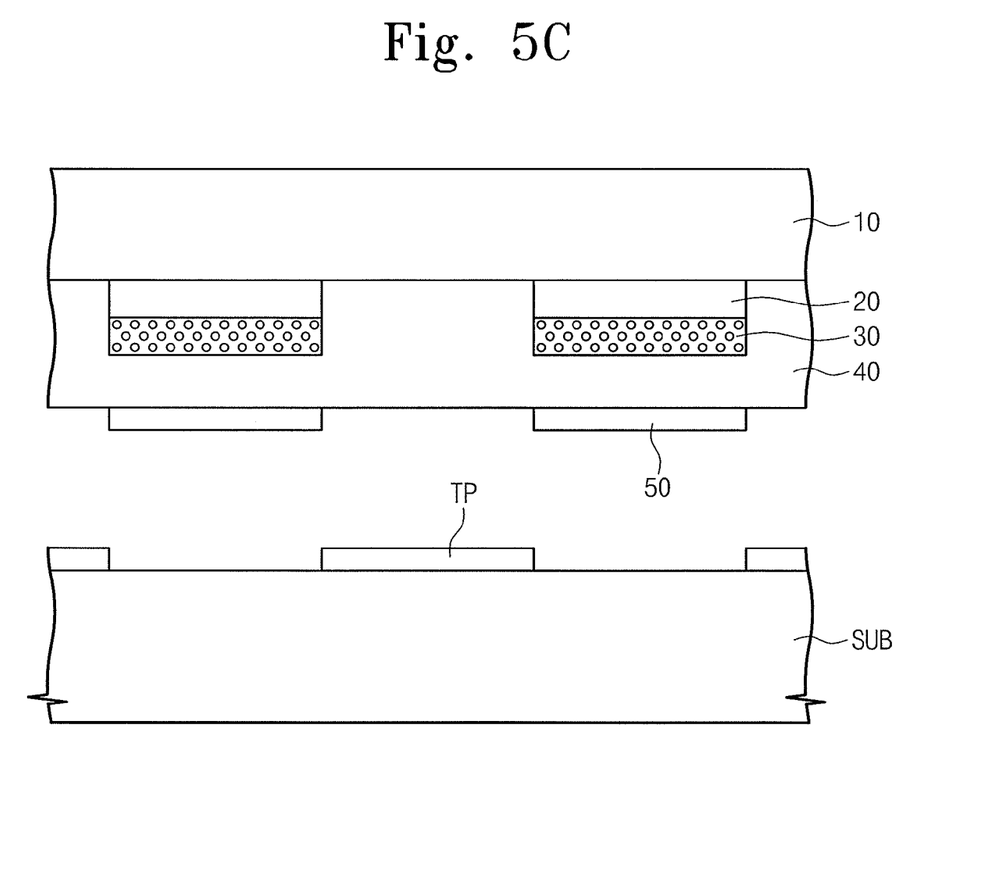

FIGS. 5A to 5C are process cross-sectional views showing a manufacturing method of a transfer pattern according to an example embodiment. Hereinafter, the method of forming the transfer pattern will be described in detail with reference to FIGS. 5A to 5C.

In the present example embodiment, referring to FIG. 5A, the donor substrate 100 is disposed on a transfer-target substrate SUB. The donor substrate 100 described with reference to FIGS. 1 to 3 may be employed. The transfer layer 50 makes contact with the transfer-target substrate SUB. The transfer-target substrate SUB may further include an insulating layer not shown in figures. The insulating layer includes an organic layer or an inorganic layer. In addition, the transfer-target substrate SUB serves as a part of the organic light emitting display substrate.

Then, as shown in FIG. 5B, a light is irradiated onto the donor substrate 100. The light is the ultraviolet light or the visible light. In addition, the light may be a laser beam with a predetermined wavelength.

Referring to FIG. 5C, when the transfer pattern TP is formed on the transfer-target substrate SUB, the donor substrate 100 is removed from the transfer-target substrate SUB. Since the heat transmitted to the area of the light-to heat conversion layer 40, which is overlapped with the light reflection layer 20, is blocked by the heat blocking pattern 30, the transfer pattern TP is formed only in the area overlapped with the first openings 20-OP.

Figure 6:
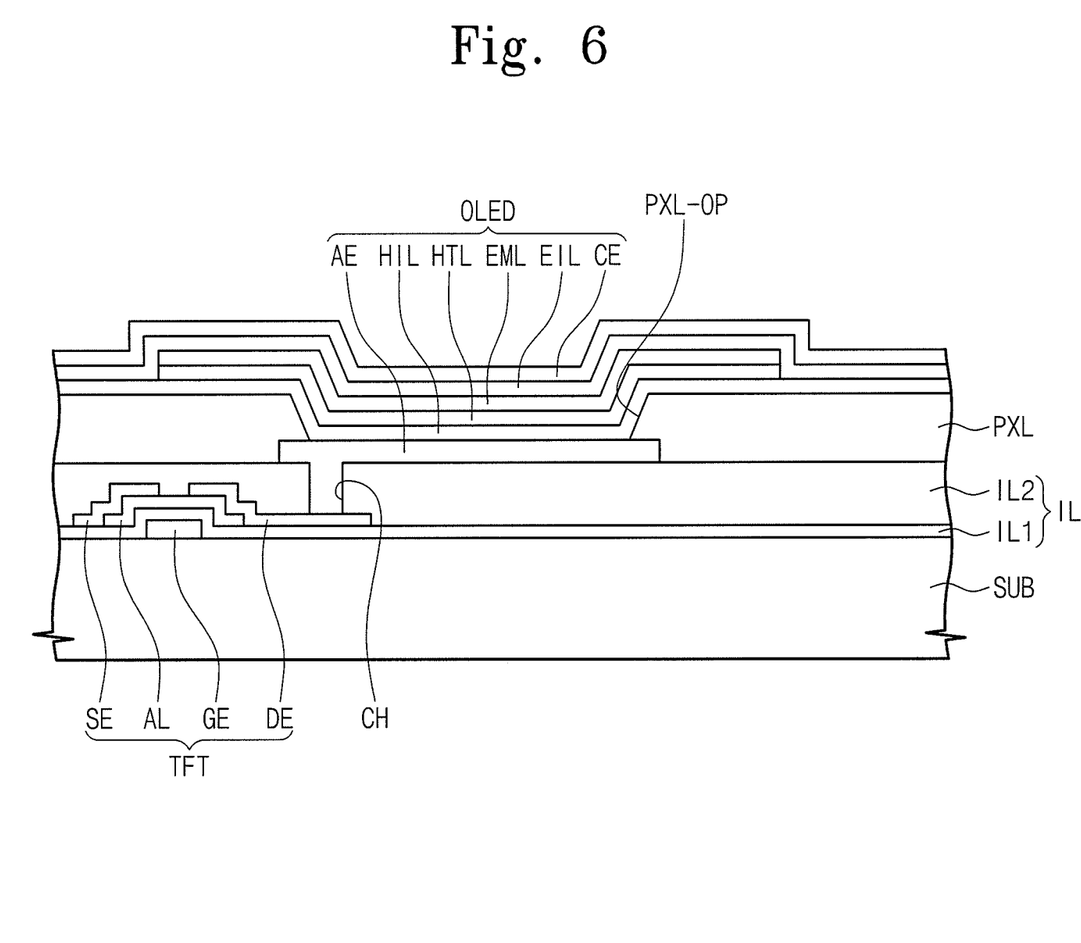
FIG. 6 is a cross-sectional view showing an organic light emitting display substrate including a transfer pattern according to an example embodiment.

FIG. 6 is a cross-sectional view showing the organic light emitting display substrate including the transfer pattern according to an example embodiment.

In the present example embodiment, the organic light emitting display substrate includes a display substrate SUB, a thin film transistor TFT disposed on the display substrate SUB, insulating layers IL, and an organic light emitting device OLED. The thin film transistor TFT and the organic light emitting diode OLED are disposed in each pixel arranged on the organic light emitting display substrate.

As shown in FIG. 6, a control electrode GE of the thin film transistor TFT is disposed on the display substrate SUB. The display substrate SUB is the transfer-target substrate SUB described with reference to FIGS. 5A to 5C.

A first insulating layer IL1 is disposed on the display substrate SUB to cover the control electrode GE. A semiconductor layer AL is disposed on the first insulating layer IL1. An input electrode SE and an output electrode DE are disposed on the first insulating layer IL1 to be overlapped with the semiconductor layer AL.

A second insulating layer IL2 covers the input electrode SE and the output electrode DE. The organic light emitting diode OLED is disposed on the second insulating layer IL2. The organic light emitting diode OLED includes a first electrode AE, a hole injection layer HIL, a hole transport layer HTL, an organic light emitting layer EML, an electron injection layer EIL, and a second electrode CE, which are sequentially stacked on the second insulating layer IL2. The first electrode AE is connected to the output electrode DE through a contact hole formed penetrating through the second insulating layer IL2.

The structure of the organic light emitting diode OLED should not be limited to the above-mentioned structure. The electron injection layer EIL may be omitted, and the organic light emitting diode OLED may further include an electron transport layer between the organic light emitting layer EML and the electron injection layer EIL.

Different from the hole injection layer HIL and the electron injection layer EIL commonly disposed between the pixels, the hole transport layer HTL and the organic light emitting layer EML are individually disposed in each pixel. The hole transport layer HTL and the organic light emitting layer EML are formed in the way described with reference to FIGS. 5A to 5C.

Figure 7:
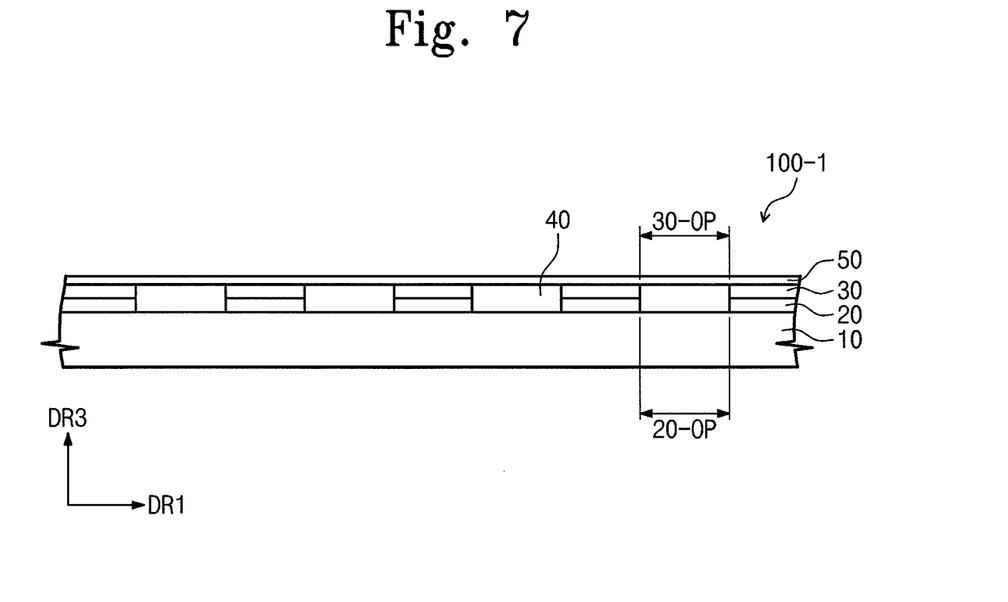
FIGS. 7 to 9 are cross-sectional views showing a donor substrate according to an example embodiment.
Figure 8:
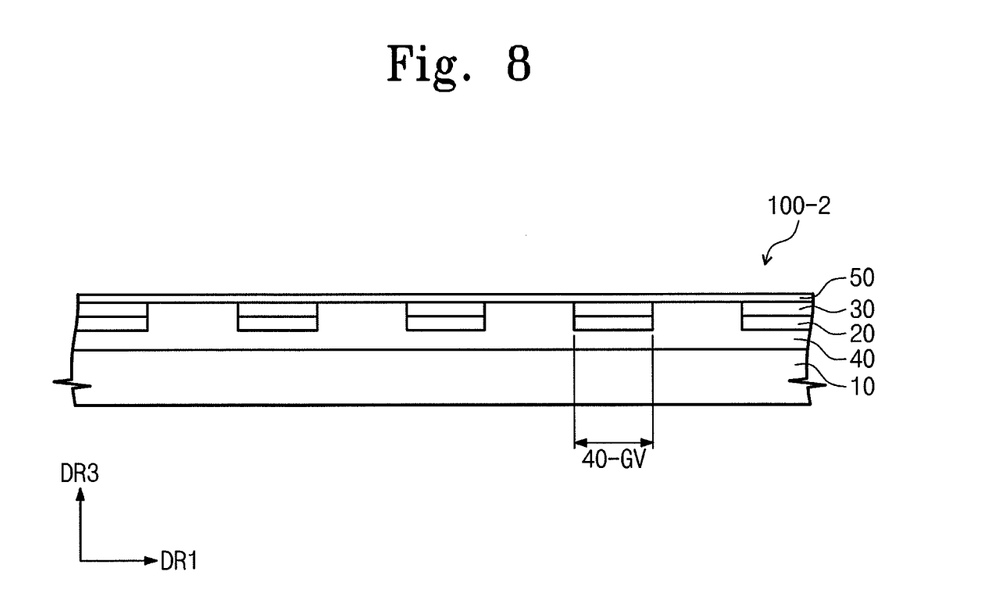
Figure 9:
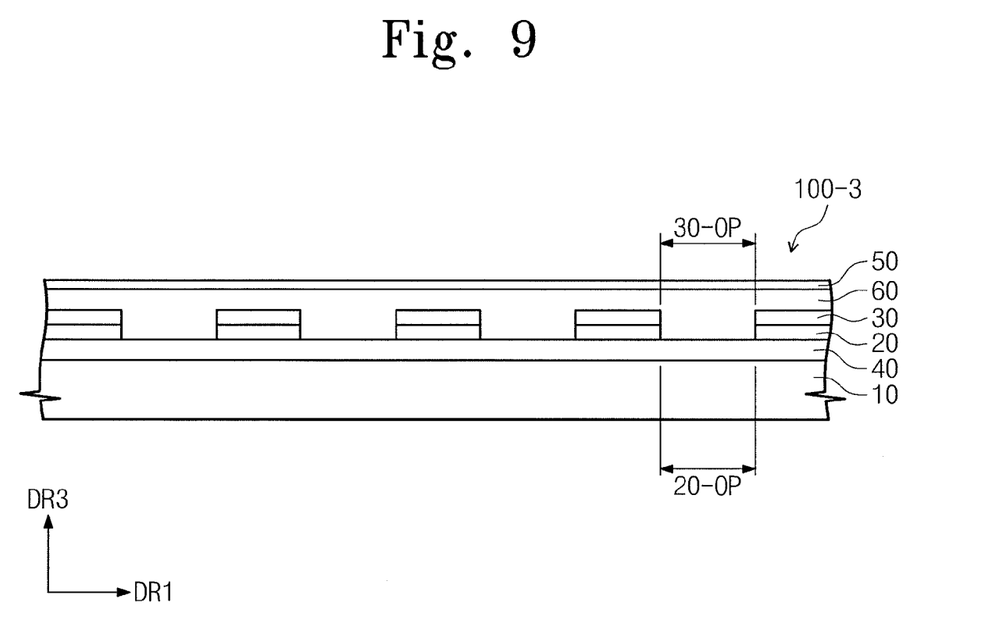

FIGS. 7 to 9 are cross-sectional views showing the donor substrate according to an example embodiment, each of which is taken along a line of I-I' of FIG. 1. Hereinafter, the donor substrates according to the present example embodiments will be described with reference to FIGS. 7 to 9. However, the same configurations as those of the donor substrate and the method of forming the transfer pattern using the donor substrate described with reference to FIGS. 1 to 6 will be omitted.

In the example embodiment shown in FIG. 7, a donor substrate 100-1 includes the base substrate 10, the light reflection layer 20, the heat blocking pattern 30, the light-to-heat conversion layer 40, and the transfer layer 50. The light reflection layer 20 is disposed on one surface of the base substrate 10. The light reflection layer 20 includes first openings 20-OP. The heat blocking pattern 30 is disposed on the light reflection layer 20. The heat blocking pattern 30 includes second openings 30-OP respectively corresponding to the first openings 20-OP.

The light-to-heat conversion layer 40 includes a plurality of light-to-heat conversion patterns. Each of the light-to-heat conversion patterns is inserted into a corresponding first opening of the first openings 20-OP and a corresponding second opening of the second openings 30-OP. A thickness of each of the light-to-heat conversion patterns in the third direction DR3 is the same as a sum of a depth of the first opening and a depth of the second opening in the third direction DR3. Thus, the light-to-heat conversion layer 40 and the heat blocking pattern 30 may be provided with a flat surface. The transfer layer 50 is disposed on the flat surface of the light-to-heat conversion layer 40 and the heat blocking pattern 30.

In the example embodiment shown in FIG. 8, a donor substrate 100-2 includes the base substrate 10, the light reflection layer 20, the heat blocking pattern 30, the light-to-heat conversion layer 40, and the transfer layer 50. The light-to-heat conversion layer 40 is disposed on one surface of the base substrate 10. The light-to-heat conversion layer 40 covers the entire of the one surface of the base substrate 10. The light-to-heat conversion layer 40 includes a groove portion 40-GV.

The light reflection layer 20 is inserted into the groove portion 40-GV to reflect a light incident thereto. The heat blocking pattern 30 is overlapped with the light reflection layer 20. The heat blocking pattern 30 is also inserted into the groove portion 40-GV.

A sum of the thickness of the light reflection layer 20 and the thickness of the heat blocking pattern 30 in the third direction DR3 is the same as a depth of the groove portion 40-GV in the third direction DR3. Thus, the heat blocking pattern 30 and the light-to-heat conversion layer 40 are provided with a flat surface. The transfer layer 50 is disposed on the flat surface of the heat blocking pattern 30 and the light-to-heat conversion layer 40.

In the example embodiment shown in FIG. 9, a donor substrate 100-3 includes the base substrate 10, the light reflection layer 20, the heat blocking pattern 30, the light-to-heat conversion layer 40, the transfer layer 50, and a planarization layer 60. The light-to-heat conversion layer 40 is disposed on one surface of the base substrate 10. The light-to-heat conversion layer 40 covers the entire of the one surface of the base substrate 10.

The light reflection layer 20 is disposed on the light-to-heat conversion layer 40. The heat blocking pattern 30 is disposed on the light reflection layer 20. The planarization layer 60 is disposed on the light-to-heat conversion layer 40 to cover the light reflection layer 20 and the heat blocking pattern 30. The planarization layer 60 is an insulating layer formed of an organic or inorganic material. The transfer layer 50 is disposed on a flat surface provided by the planarization layer 60.

By way of summation and review, a light-to-heat transfer method may be performed using a donor substrate. The donor substrate may include a light-to-heat conversion layer to convert light provided from a light source to heat and a light reflection layer to reflect the light. As a light absorbance of the light-to-heat conversion layer becomes higher, the transfer pattern may be easily transferred. In addition, as a light reflectance of the light reflection layer becomes higher, the transfer may occur only in a specific area. The transfer may not easily occur in an area of a transfer layer, which is overlapped with the light reflection layer. However, the light may still be absorbed at a uniform rate in the area of the transfer layer, which is overlapped with the light reflection layer. Thus, the transfer may occur in the area of the transfer layer that is overlapped with the light reflection layer.

As described above, embodiments relate to a donor substrate having a heat blocking pattern and a method of forming a transfer pattern using the donor substrate. According to an embodiment, a donor substrate may be configured such that a transfer occurs only in a specific area thereof. Embodiments may also provide a method of forming a transfer pattern using the donor substrate. According to embodiments, the transfer may occur only in a specific area of the donor substrate. The heat blocking pattern helps prevent the heat from being transmitted to the transfer layer that is overlapped with the light reflection layer. Thus, the transfer of the transfer layer may occur only in the area that is overlapped with the openings of the light reflection layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A donor substrate, comprising:
a base substrate;
a light reflection layer disposed on the base substrate and overlapped with a portion of the base substrate;
a heat blocking pattern disposed on the light reflection layer, overlapped with the light reflection layer, and including a plurality of air holes;
a light-to-heat conversion layer disposed on the base substrate; and
a transfer layer disposed on the light-to-heat conversion layer.

2. The donor substrate as claimed in claim 1, wherein each of the air holes of the heat blocking pattern has a diameter from about 1 nm to about 50 nm.

3. The donor substrate as claimed in claim 1, wherein the heat blocking pattern includes at least one of silicon oxide and silicon nitride.

4. The donor substrate as claimed in claim 1, wherein the heat blocking pattern has a thickness from about 10 nm to about 10 μm.

5. The donor substrate as claimed in claim 1, wherein the light reflection layer includes a metal material.

6. The donor substrate as claimed in claim 5, wherein the metal material includes aluminum, silver, or an alloy thereof.

7. The donor substrate as claimed in claim 1, wherein the light reflection layer includes a plurality of openings.

8. The donor substrate as claimed in claim 7, wherein the heat blocking pattern has a same shape as the light reflection layer.

9. The donor substrate as claimed in claim 8, wherein the light-to-heat conversion layer is overlapped with openings of the heat blocking pattern and the light reflection layer.

10. The donor substrate as claimed in claim 8, wherein:
the light-to-heat conversion layer includes a plurality of light-to-heat conversion patterns, the light-to-heat conversion patterns being inserted into the openings of the heat blocking pattern and the light reflection layer, and the light-to-heat conversion patterns and the heat blocking pattern are provided with a flat surface.

11. The donor substrate as claimed in claim 1, wherein the light reflection layer is disposed on the light-to-heat conversion layer.

12. The donor substrate as claimed in claim 11, wherein the light-to-heat conversion layer includes a groove portion, the light reflection layer and the heat blocking pattern being inserted into the groove portion.

13. The donor substrate as claimed in claim 11, further comprising a planarization layer disposed between the light-to-heat conversion layer and the transfer layer, the planarization layer covering the light reflection layer and the heat blocking pattern.

14. A method of forming a transfer pattern, the method comprising:
disposing a donor substrate on a transfer-target substrate, the donor substrate including a base substrate, a light reflection layer disposed on the base substrate and overlapped with a portion of the base substrate, a heat blocking pattern disposed to overlap with the light reflection layer and including a plurality of air holes, a light-to-heat conversion layer disposed on the base substrate, and a transfer layer disposed on the light-to-heat conversion layer, the transfer layer contacting the transfer-target substrate;
irradiating a light onto the donor substrate to transfer a transfer pattern on the transfer-target substrate; and
removing the donor substrate from the transfer-target substrate.

15. The method as claimed in claim 14, wherein the transfer pattern serves as a part of an organic light emitting device.

16. The method as claimed in claim 15, wherein the transfer pattern is a hole transport layer or an organic light emitting layer, which corresponds to the part of the organic light emitting device.

17. The method as claimed in claim 14, wherein the light reflection layer includes a plurality of openings.

18. The method as claimed in claim 17, wherein the heat blocking pattern has a same shape as the light reflection layer.

19. The method as claimed in claim 18, wherein the light-to-heat conversion layer is overlapped with openings of the heat blocking pattern and the light reflection layer.

20. The method as claimed in claim 18, wherein:
the light-to-heat conversion layer includes a plurality of light-to-heat conversion patterns, the light-to-heat conversion patterns being inserted into the openings, and the light-to-heat conversion patterns and the heat blocking pattern are provided with a flat surface.

21. The method as claimed in claim 14, wherein the light reflection layer is disposed on the light-to-heat conversion layer.

22. The method as claimed in claim 21, wherein the light-to-heat conversion layer includes a groove portion, the light reflection layer and the heat blocking pattern being inserted into the groove portion.

23. The method as claimed in claim 21, further comprising a planarization layer disposed between the light-to-heat conversion layer and the transfer layer to cover the light reflection layer and the heat blocking pattern.

* * * * *